(12) United States Patent
Takasu et al.

(10) Patent No.: US 7,179,147 B2
(45) Date of Patent: Feb. 20, 2007

(54) MANUFACTURING METHOD OF ELECTROLUMINESCENT DEVICE

(75) Inventors: Takako Takasu, Kanagawa (JP); Satoshi Seo, Kanagawa (JP); Ryoji Nomura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/827,144

(22) Filed: Apr. 19, 2004

(65) Prior Publication Data

US 2004/0213898 A1    Oct. 28, 2004

(30) Foreign Application Priority Data

Apr. 24, 2003   (JP) ............................. 2003-119306

(51) Int. Cl.
*H01J 9/24* (2006.01)

(52) U.S. Cl. .......................................... 445/24; 445/25

(58) Field of Classification Search ............ 445/24–25, 445/10–14; 427/66, 487; 205/317, 118, 205/192

See application file for complete search history.

(56) References Cited

U.S. PATENT DOCUMENTS

| | | | | |
|---|---|---|---|---|
| 5,089,359 A | * | 2/1992 | Ohsawa et al. | ............. 205/419 |
| 5,952,115 A | * | 9/1999 | Hu et al. | ..................... 428/690 |
| 6,548,144 B1 | * | 4/2003 | Teshima et al. | ............. 428/138 |
| 6,602,395 B1 | * | 8/2003 | Zhuang et al. | ............... 205/317 |
| 6,656,339 B2 | * | 12/2003 | Talin et al. | .................. 205/109 |
| 6,656,393 B2 | * | 12/2003 | Yagi et al. | ................... 264/2.5 |
| 6,747,405 B2 | * | 6/2004 | Hosokawa | .................. 313/504 |
| 6,885,489 B2 | * | 4/2005 | Arai et al. | .................. 359/265 |

FOREIGN PATENT DOCUMENTS

| | | | |
|---|---|---|---|
| JP | 07073969 A | * | 3/1995 |
| JP | 08045667 A | * | 2/1996 |
| JP | 09-097679 | | 4/1997 |
| JP | 9-97679 | | 4/1997 |
| JP | 09097679 A | * | 4/1997 |

* cited by examiner

*Primary Examiner*—Nimeshkumar D. Patel
*Assistant Examiner*—Dalei Dong
(74) *Attorney, Agent, or Firm*—Cook, Alex, McFarron, Manzo, Cummings & Mehler, Ltd.

(57) ABSTRACT

An electroluminescent element which is superior in luminescence properties and lifetime can be provided by forming a thin film with high controllability according to the invention. An electroluminescent layer is formed over a first electrode by applying a current density of from 0.4 to 1.5 mA/cm$^2$ for from 0.8 to 3.0 seconds to a first electrode of the electroluminescent element in accordance with the fact that an electrolytic polymerization film can be formed over the surface of the electrode uniformly by keeping a current density and time for applying the current to the electrode within a predetermined range during electrolytic polymerization especially when the electrolytic polymerization film is required to be a thin film.

22 Claims, 12 Drawing Sheets

(1) light emitting layer (Alq$_3$)
(2) hole transporting layer ($\alpha$-NPD)
(3) hole injecting layer (PEDOT)

MANUFACTURING METHOD OF ELECTROLUMINESCENT DEVICE

BACKGROUND OF THE INVENTION

1. Field of the Invention

The present invention relates to a method for manufacturing an electroluminescent element including an electroluminescent layer between a pair of electrodes.

2. Related Art

An electroluminescent element includes an electroluminescent layer interposed between a pair of electrodes (anode and cathode). The emission mechanism is as follows. Upon applying a voltage between the pair of electrodes, holes injected from the anode and electrons injected from the cathode are recombined with each other at luminescent centers within the electroluminescent layer to lead to formation of molecular excitons, and the molecular excitons return to the ground state while radiating energy to emit photon.

An electroluminescent layer in the electroluminescent element can be formed by a low molecular weight material or a high molecular weight material by vapor deposition (including vacuum vapor deposition), spin coating, ink jetting, dipping, electrolytic polymerization, or the like.

These methods are appropriately selected depending on properties of materials or a shape of a film. For example, electrolytic polymerization is used to pattern form a film formed by high molecular weight materials. (For example, refer to Japanese Unexamined Patent Publication No. 9-97679.)

However, sufficient planarity of a deposited film is not available through the conventional electrolytic polymerization at present.

By the fact that an electroluminescent layer used for an electroluminescent element is formed to have a thickness of approximately from 1 to 100 nm, the planarity of the deposited film influences device characteristics of an electroluminescent element such as luminescence properties or lifetime.

SUMMARY OF THE INVENTION

In view of the foregoing, it is an object of the present invention to provide an electroluminescent element which is superior in luminescence properties and lifetime by forming a thin film with high controllability.

The inventors found that a current applied to the surface of an electrolytic polymerization film can be equalized by keeping current density and time for applying a current to an electrode for electrolytic polymerization within a predetermined range, consequently, the electrolytic polymerization film can be deposited uniformly over the surface of an electrode especially when the electrolytic polymerization film is required to be formed into a thin film.

Therefore, a constituent feature of the invention is a method for manufacturing an electroluminescent element including a step of forming an electroluminescent layer between a pair of electrodes by an electrochemical method, wherein the electroluminescent layer is formed in the condition that a current density of from 0.4 to 1.5 $mA/cm^2$ is applied to a first electrode for from 0.8 to 3.0 seconds.

Moreover, in accordance with the fact that an electrolytic polymerization film can be formed with high controllability especially when the electrolytic polymerization film is formed to be thin, total quantity of electrical charge per unit area of the first electrode is controlled in order to control the thickness of the electrolytic polymerization film. Hence, according to the invention, the electrolytic polymerization film is formed in the condition that total quantity of electrical charge per unit area of the first electrode is from 1.0 to 1.2 $mC/cm^2$.

In the above each constituent feature, as an electroluminescent layer formed by the electrochemical method, a hole injecting layer, a hole transporting layer, a light-emitting layer, a hole blocking layer, or an electron transporting layer can be formed. Above all, the electrochemical method is suitable for the formation of the hole injecting layer in forming a thin film with high controllability.

In the above each constituent feature, as a material for forming the electroluminescent layer by an electrolytic polymerization, a compound selected form the group consisting of pyrrol, indol, thiophene, 3,4-ethylenedioxythiophene, benzene, naphthalene, azulene, and phenylene oxide can be used.

In forming an electroluminescent layer by an electrolytic polymerization, a thin film can be formed with high controllability by keeping current density and time for polymerization within a predetermined range, consequently, an electroluminescent element which is superior in device characteristics such as luminescence properties to the conventional electroluminescent element.

These and other objects, features and advantages of the present invention will become more apparent upon reading of the following detailed description along with the accompanied drawings.

DESCRIPTION OF THE INVENTION

Embodiment Mode

A method for manufacturing an electroluminescent element according to the present invention is explained with reference to FIGS. 1A and 1B in this embodiment. Like components between FIGS. 1A and 1B are denoted by like numerals.

Figure 1A:
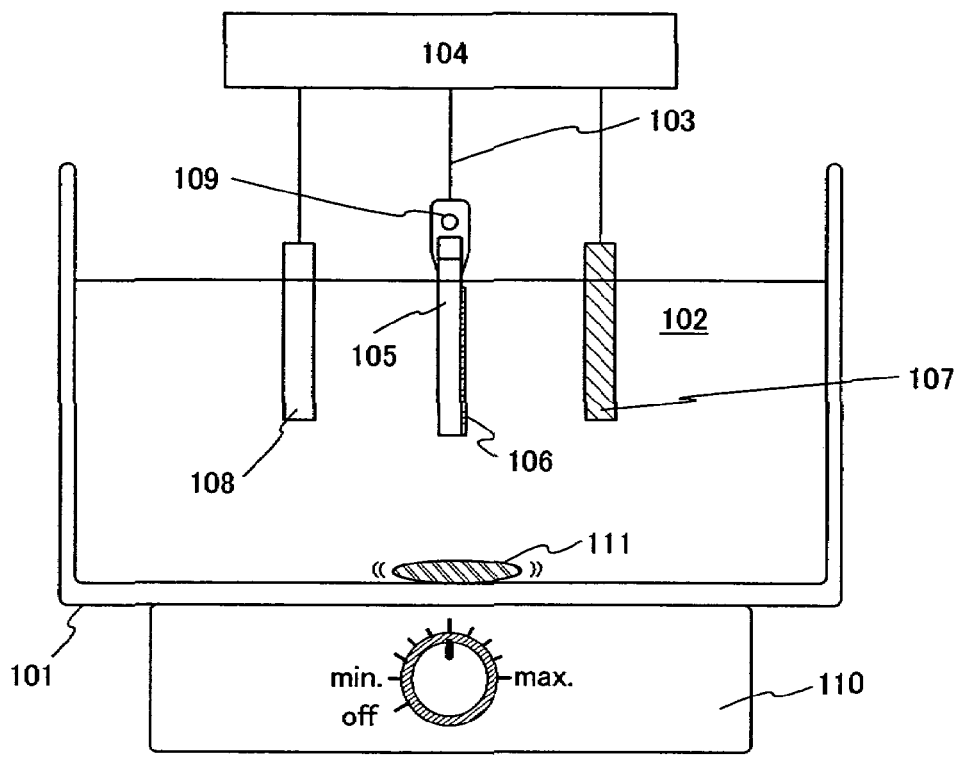
FIGS. 1A and 1B are explanatory views for electrolytic polymerization.
Figure 1B:
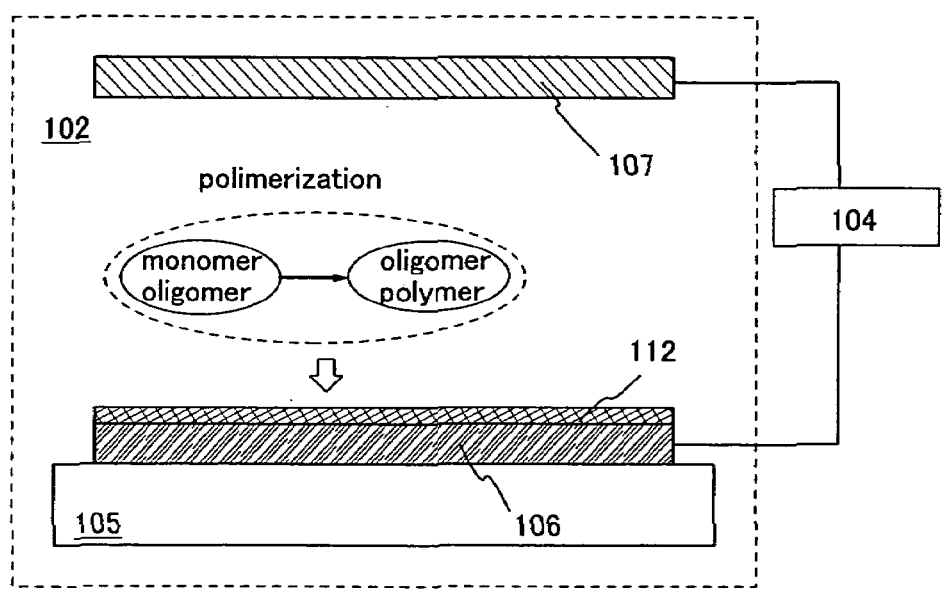

According to the invention, a part of an electroluminescent layer is formed over an electrode (first electrode) 106 which is formed over a substrate 105 by electrolytic polymerization using equipment as illustrated in FIG. 1A. As materials for the substrate 105, glass, quartz, transparent plastics, or the like can be used.

In addition, the first electrode 106 may serve as either an anode or a cathode. A plurality of the first electrodes 106 may be pattern formed over the substrate 105.

In the case that the first electrode 106 serves as an anode, metals having large work functions (at least 4.0 eV), alloys, compounds having electrical conduction properties, and mixture of these materials can be preferably used as anode materials. As specific examples of the anode materials, ITO (indium tin oxide), IZO (indium zinc oxide) composed of indium oxide mixed with zinc oxide (ZnO) of from 2 to 20%, aurum (Au), platinum (Pt), nickel (Ni), tungsten (W), chrome (Cr), molybdenum (Mo), ferrum (Fe), cobalt (Co), copper (Cu), palladium (Pd), nitride of metal materials (for example, TiN), or the like can be used.

In the case that the first electrode 106 serves as a cathode, metals having small work functions (at most 3.8 eV), alloys, compounds having electrical conduction properties, and mixture of these materials can be preferably used as cathode materials. As specific examples of the cathode materials, a transition metal containing a rare earth metal can be used, besides an element in the first or second periodic row, that is, an alkaline metal such as Li, Cs, or the like, alkaline earth metal such as Mg, Ca, Sr, or the like, alloys of these elements (Mg:Ag, Al:Li), or compounds (LiF, CsF, CaF$_2$). Alternatively, the first electrode 106 can be formed by transition metal containing rare earth metal and a lamination layer of the transition metal and metals such as Al, Ag, or ITO (including alloys).

The above anode and cathode materials are deposited by vapor deposition or sputtering to form a thin film. The thin film is preferably formed to have a thickness of from 10 to 500 nm.

In the electroluminescent element according to the invention, in the case that the first electrode 106 serves as an anode, the second electrode which is formed in later process serves as a cathode.

An electroluminescent element according to the invention has the structure that light generated by recombination of carries within an electroluminescent layer emits from either the first electrode 106 or the second electrode, or both of the electrodes. When light emits from the first electrode 106, the first electrode 106 is formed by materials having light transmission properties. When light emits from the second electrode, the second electrode is formed by a material having light transmission properties. The case that the first electrode 106 serves as an anode formed by materials having light transmission properties and the second electrode serves as a cathode formed by materials having light shielding properties is explained in this embodiment.

As shown in FIG. 1A, a reaction tank 101 holds electrolytic solution 102, and the electrolytic solution 102 is provided with a substrate 105 having the first electrode 106 electrically connected to a power source 104 via a wiring 103, a counter electrode 107, and a reference electrode 108. In addition, the substrate 105 is secured by a support medium 109 which connects electrically the first electrode 106 to the wiring 103.

The power source 104 includes a potentiostat which is capable of applying a constant electric potential and a coulombmeter which measures an amount of a flowing electric charge. The counter electrode 107 is formed by platinum. Further, the reference electrode 108 is formed by Ag/AgCl.

The reaction tank 101 is provided over a magnetic stirrer 110. In the reaction tank 110, a rotator 111 in the electrolytic solution 102 is controlled by the magnetic stirrer 110 to stir continuously the electrolytic solution 102.

When a predetermined current is applied to the counter electrode 107, and the first electrode 106 over the substrate 105 via the support medium 109, respectively, monomer or oligomer in the electrolytic solution 102 are polymerized on the surface of the first electrode 106 by electrolytic polymerization to form a first electroluminescent layer (electrolytic polymerization film) 112 containing polymer as its main components. According to the invention, an electrolytic polymerization film with surface roughness of at most 6.0 nm, preferably, from 4.0 to 5.0 nm can be formed by setting the condition, that is, the first electrode 106 used has the size of 0.04 cm$^2$, the current is applied from the power source 104 at from 0.016 to 0.06 mA, and the current is applied for from 0.8 to 3.0 sec. Consequently, decline in luminous efficiency or deterioration of an electroluminescent element due to electric voltage concentration which becomes a problem caused by poor planarity of a film surface can be prevented, and device characteristics and lifetime can be improved.

In the invention, as a supporting electrolyte contained in the electrolytic solution 102, salts such as natrium perchlorate, lithium perchlorate, tetrabutylammonium perchlorate (hereinafter, TBAP), or tetrabutylammonium tetrafluoroborate; another bases; or acids can be used. The solvent for the electrolytic solution 102 can be selected from the group consisting of water, acetonitrile, benzonitrile, N,N-dimethylformamide, dichloromethane, tetrahydrofuran, propione carbonate; or mixed solvent of a plurality kinds of the solvents can be used.

As monomer or oligomer contained in the electrolytic solution 102, aniline, phenylene oxide, or the like can be used in addition to thiophene based materials (specifically, thiophene, 3,4-ethylenedioxythiophene, or the like), pyrrol based materials (specifically, pyrrol, indol, or the like), or aromatic hydrocarbon based materials (specifically, benzene, naphthalene, azulene, or the like).

Figure 2:
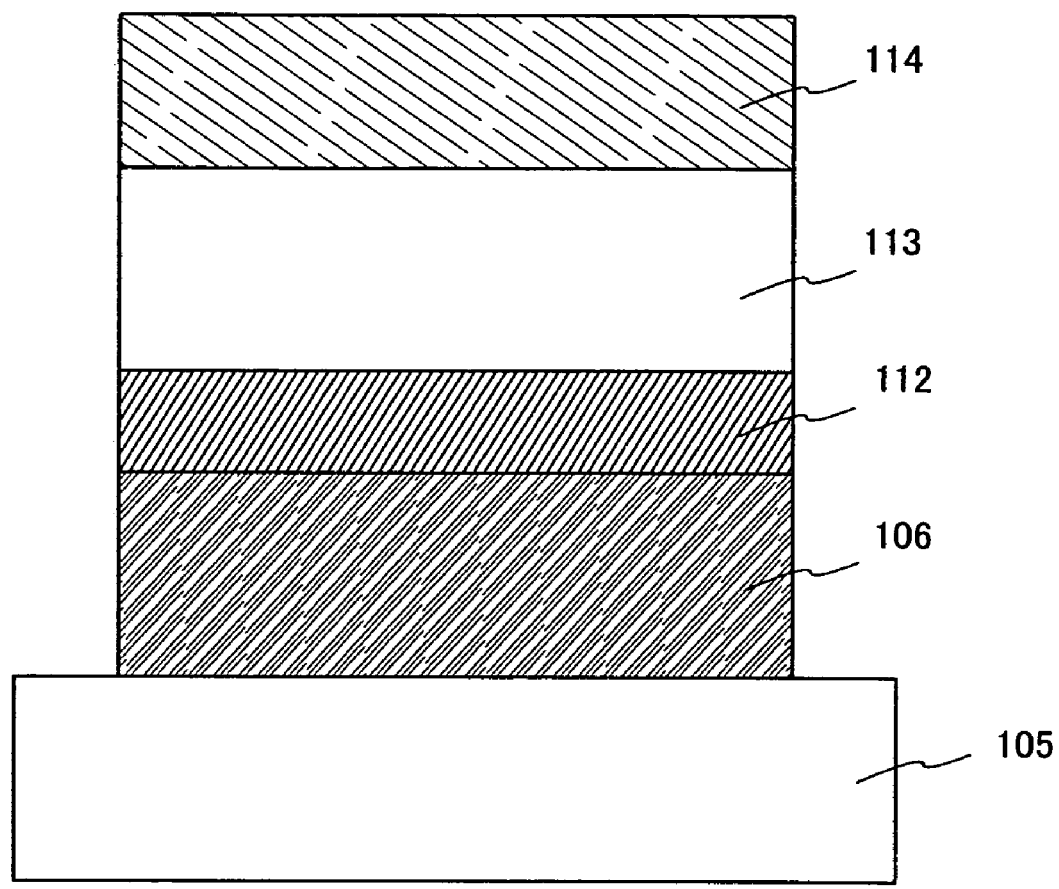
FIG. 2 is an explanatory view for a device configuration of an electroluminescent element.

A second electroluminescent layer 113 is formed over a first electroluminescent layer 112. In the invention, in the case that the first electroluminescent layer 112 is formed by a single layer which can emit light (the first electroluminescent layer 112 includes a light-emitting layer), a second electrode can be formed over the first electroluminescent layer 112. In this embodiment, the case that the second electroluminescent layer (including a light-emitting layer) is stacked over the first electroluminescent layer 112 (not including a light-emitting layer) formed by an electrolytic polymerization film is explained with reference to FIG. 2.

In this embodiment, the first electroluminescent layer 112 is a hole injecting layer, and the second electroluminescent layer 113 can be formed by a single layer or a lamination layer including at least a light-emitting layer. In case of forming a lamination layer, a hole transporting layer, a hole blocking layer, an electron transporting layer, or the like can be formed besides the light-emitting layer by vapor deposition, coating, ink jetting, or the like.

In the case that the first electroluminescent layer 112 formed by an electrolytic polymerization film forms an hole injecting layer, aniline, phenylene oxide, or the like can be used in addition to thiophene based materials or pyrrol based materials such as thiophene, 3,4-ethylenedioxythiophene, pyrrol, or indol can be used as monomer or oligomer.

In the case that a hole transporting layer is included in the second electroluminescent layer 113, aromatic amine (that is, the one having a benzene ring-nitrogen bond) compounds are preferably used as hole transportation materials. For example, besides 4,4'-bis[N-(3-methylphenyl)-N-phenyl-amino]-biphenyl (hereinafter, TPD), derivatives thereof such as 4,4'-bis[N-(1-naphthyl)-N-phenyl-amino]-biphenyl (hereafter, a-NPD) is widely used. Also used are star burst aromatic amine compounds, including 4,4',4''-tris(N,N-diphenyl-amino)-triphenyl amine (hereafter, TDATA), and 4,4',4''-tris[N-(3-methylphenyl)-N-phenyl-amino]-triphenyl amine (hereafter, MTDATA).

As light-emitting materials for forming the light-emitting layer included in the second electroluminescent layer 113, in specific, various-fluorescent dyes are useful, besides metal complexes such as tris(8-quinolinolate)aluminum (hereinafter, $Alq_3$), tris(4-methyl-8-quinolinolate)aluminum (hereinafter, $Almq_3$), bis(10-hydroxybenzo[h]-quinolinato)beryllium (hereinafter, $BeBq_2$), bis(2-methyl-8-quinolinolate)-(4-hydroxy-biphenylyl)-aluminum (hereinafter, BAlq), bis[2-(2-hydroxyphenyl)-benzooxazolate]zinc (hereinafter, $Zn(BOX)_2$), and bis[2-(2-hydroxyphenyl)-benzothiazolate] zinc (hereinafter, $Zn(BTZ)_2$). Additionally, a triplet luminescent material containing mainly complexes with platinum or iridium as central metals can be used. As a triplet luminescent material, tris(2-phenylpyridine)iridium (hereinafter, $Ir(ppy)_3$), 2,3,7,8,12,13,17,18-octaethyl-21H, 23H-porphyrin-platinum (hereinafter, PtOEP), or the like can be used.

In the case that a hole blocking layer is included in the second electroluminescent layer 113, Balq, 1,3-bis[5-(p-tert-butylphenyl)-1,3,4-oxadiazole-2-yl]benzene (hereafter, OXD-7), triazole derivatives such as 3-(4-tert-butylphenyl)-4-phenyl-5-(4-biphenylyl)-1,2,4-triazole (hereafter, TAZ) and 3-(4-tert-butylphenyl)-4-(4-ethylphenyl)-5-(4-biphenylyl)-1,2,4-triazole (hereafter, p-EtTAZ), bathophenanthroline (hereafter, BPhen), and bathocuproin (hereafter, BCP) can be used as hole blocking materials.

In the case that an electron transporting layer is included in the second electroluminescent layer 113, metal complexes having a quinoline skeleton or benzoquinoline skeleton, such as the aforementioned $Alq_3$, $Almq_3$, $BeBq_2$; and mixed ligand complexes such as $BAlq_2$ are useful as electron transporting materials. In addition, metal complexes having oxazole-based and thiazole-based ligands such as $Zn(BOX)_2$ and $Zn(BTZ)_2$ can be used. Further, oxadiazole derivatives such as 2-(4-biphenyl)-5-(4-tert-butylphenyl)-1,3,4-oxadiazole (hereafter, PBD), and OXD-7, triazole derivatives such as TAZ and p-EtTAZ, phenanthroline derivatives such as bathophenanthroline (BPhen), and bathocuproin (BCP) can be used.

Then, a second electrode 114 serving as a cathode is formed over the second electroluminescent layer 113. As cathode materials for the second electrode 114, above described materials may be used.

Accordingly, an electroluminescent element including an electroluminescent layer formed between a pair of electrodes by electrolytic polymerization can be manufactured.

EXAMPLE 1

In this example, an electroluminescent element using an electrolytic polymerization film formed by electrolytic polymerization as an electroluminescent layer will be explained with reference to FIG. 3.

A first electrode 301 is formed by ITO over a substrate 300. The area of the first electrode 301 according to this example is $2 \times 2$ mm$^2$.

Then, a first electroluminescent layer 302 is formed over the first electrode 301 by electrolytic polymerization explained with reference to FIG. 1A. Further, electrolytic solution in a reaction tank contains thiophene of 10 mM as monomer, acetonitrile as a solvent, and TBAP of 0.1 M as a supporting electrolyte.

The substrate 300 is secured by a supporting medium, then, soaked and immersed in the electrolytic solution. Next, a first electroluminescent layer 302 is formed over the first electrode 301 by applying a predetermined current from the power source for predetermined time. The area of the first electrode 301 according to this example is $2 \times 2$ mm$^2$. Considering that the thickness of a film formed by electrolytic polymerization depends on the total quantity of electric charge per unit area (mC/cm$^2$), time for applying a current is controlled so that the total quantity of electrical charge per unit area is 1.2 mC/cm$^2$. Consequently, the first electroluminescent layer 302 is formed by an electrolytic polymerization film (PEDOT: poly(3,4-ethylene dioxythiophene) to serve as a hole injecting layer 311.

Drying treatment for the substrate can be carried out according to the following procedure. The first electroluminescent layer 302 is formed, the substrate is taken together with the supporting medium out of the electrolytic solution, and the substrate is dried at a temperature of from room temperature to 150° C. in vacuo. According to this example, the substrate is dried at a temperature of 110° C.

Then, a second electroluminescent layer 303 is formed over the first electroluminescent layer 302. According to this example, the second electroluminescent layer 303 is formed to have a lamination layer comprising a hole transporting layer 312 and a light-emitting layer 313 by vapor deposition.

The substrate 300 provided with the first electroluminescent layer 302 is secured with a substrate holder of a commercial vacuum deposition equipment in such a way that the surface provided with the first electroluminescent layer 302 is down. Then, α-NPD is put into an evaporation source installed in the internal of the vacuum deposition equipment. And then, the hole transporting layer 312 is formed to have a thickness of 30 nm by vapor deposition with a resistive heating method.

Next, a light-emitting layer 313 is formed. Within the light-emitting layer 313, holes and electrons are recombined with each other to emit light. Here, $Alq_3$ is deposited to have a thickness of 50 nm in accordance with the same procedure conducted for forming the hole transporting layer 312.

After stacking the first electroluminescent layer 302 and the second electroluminescent layer 303, a second electrode 304 is formed to serve as a cathode by vapor deposition or sputtering. According to this embodiment, the second electrode 304 is formed to have a lamination structure by depositing calcium fluoride (CaF) to have a thickness of 2 nm by vapor deposition over the second electroluminescent layer 303, and aluminum (Al) is deposited to have a thickness of 100 nm by vapor deposition thereon.

For examining variation of planarity of the surface according to change of current density during forming the first electroluminescent layer 302 by electrolytic polymerization, surface observation of the first electroluminescent layer 302 was carried out by Atomic Force Microscope (AFM). Table 1 shows the measurement conditions. FIGS. 10A to 10D and 11A to 11D show the measurement results. In FIGS. 10A to 10D and 11A to 11D, 10A shows the surface state of the first electrode 301 formed by ITO, and 10B to 11D show the surface state of the first electroluminescent layer 302 formed in accordance with the conditions of current density and time for applying a current as shown in Table 1.

TABLE 1

| Measurement condition | 10A | 10B | 10C | 10D | 11A | 11B | 11C | 11D |
|---|---|---|---|---|---|---|---|---|
| Current density (mA/cm$^2$) | — | 0.05 | 0.10 | 0.40 | 0.60 | 1.00 | 1.50 | 2.00 |
| Time (sec.) | — | 24.0 | 12.0 | 3.0 | 2.0 | 1.2 | 0.8 | 0.6 |

Figure 4:
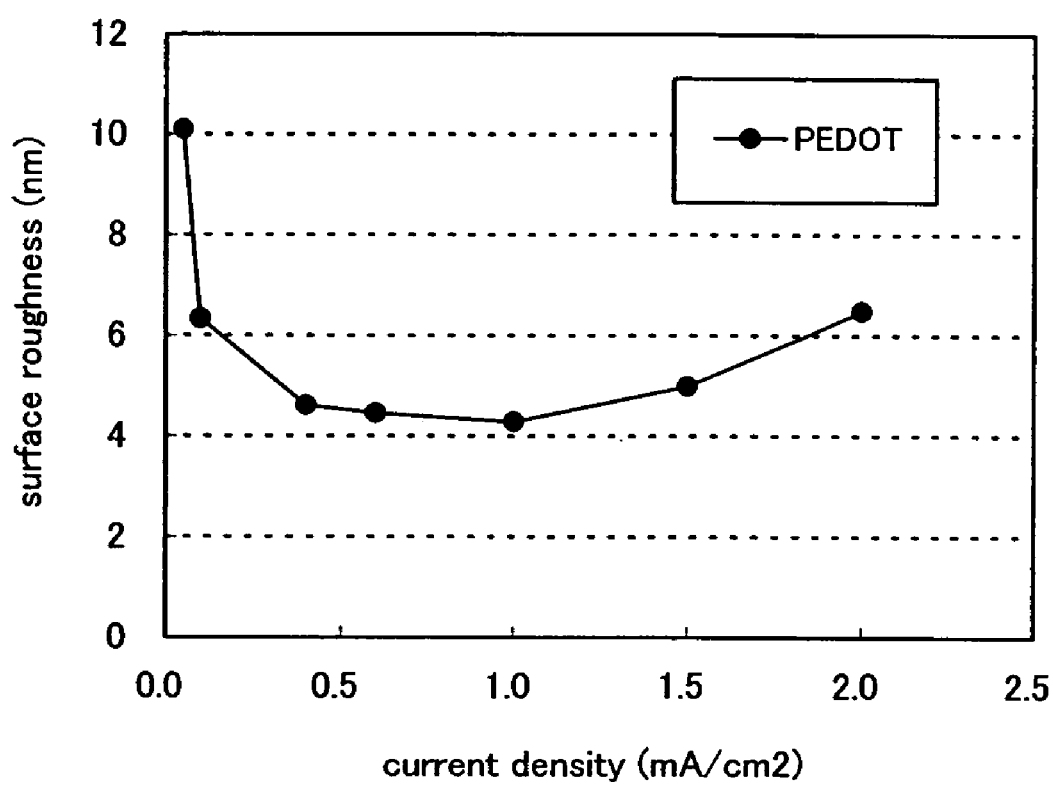
FIG. 4 is a graph for showing relationship between current density and a arithmetic roughness average.

FIG. 4 shows the planarity of a film surface obtained from the surface observation shown in FIGS. 10A to 10D and 11A to 11D. The planarity of a film surface is described by a arithmetic roughness average (Ra). In addition, the term as used herein "arithmetic roughness average" refers to centerline roughness which is extended to three dimensions for applying roughness of the surface of a film. The centerline roughness is defined by JIS B0601.

As shown in FIG. 4, the horizontal axis represents a current density per unit area, which is converted from current value applied from a power source during electrolytic polymerization, and the vertical axis represents an arithmetic roughness average of the surface of a deposited film.

The results show that an arithmetic roughness average (Ra) can be reduced especially when the current density falls within the range of 0.4 to 1.5 mA/cm$^2$ and the time for applying a current falls within the range of 0.8 to 3.0 sec. Consequently, a film which has excellent planarity can be formed.

Figure 3:
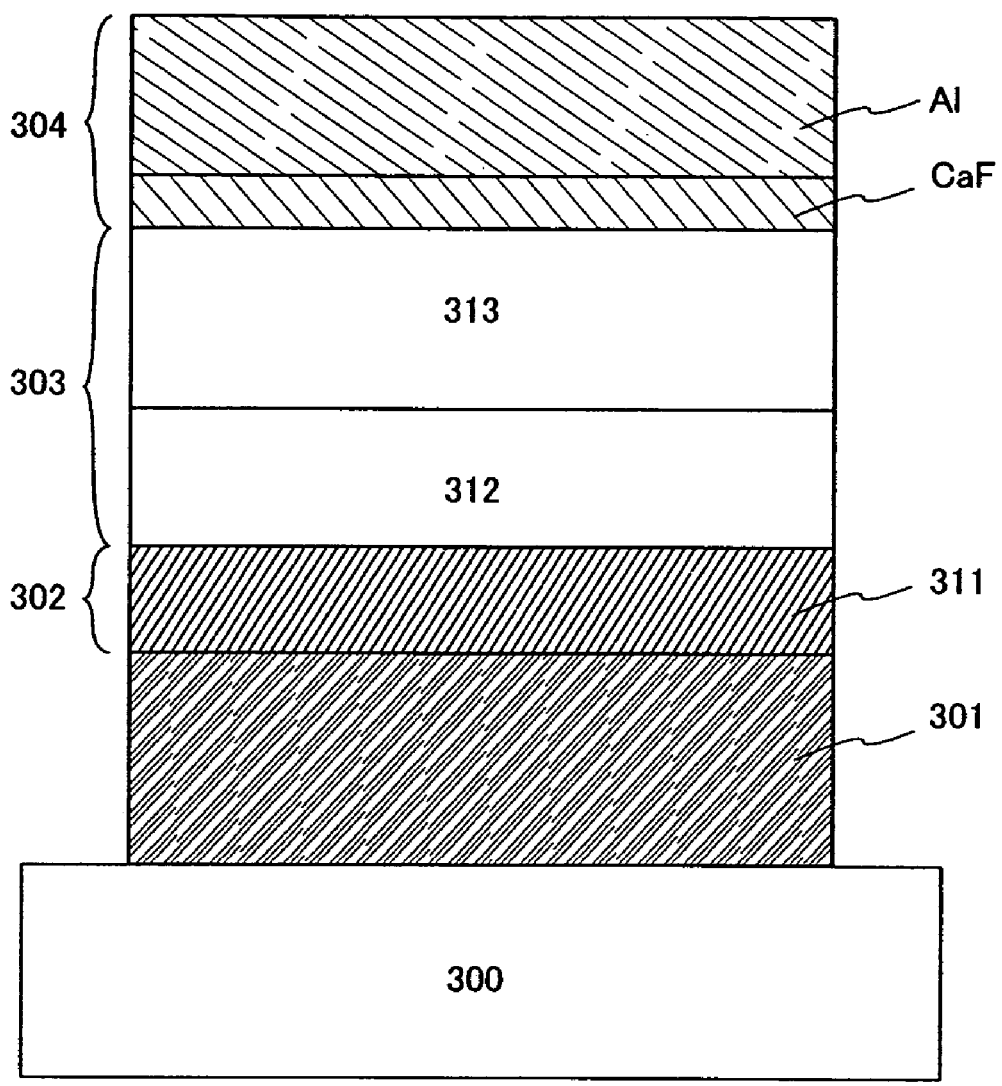
FIG. 3 is an explanatory view for a device configuration of an electroluminescent element.
Figure 5:
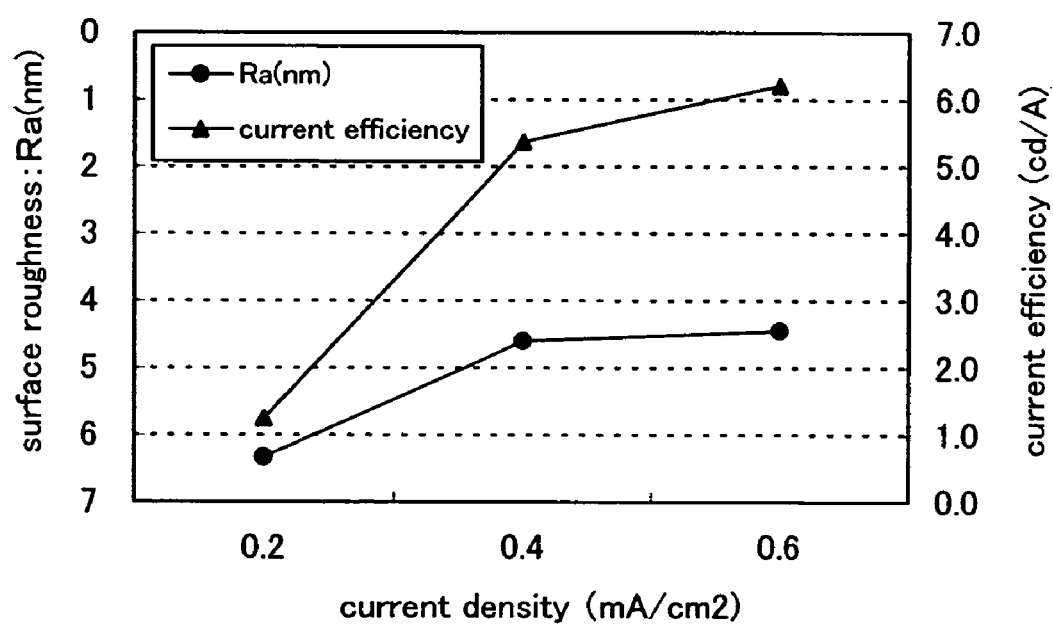
FIG. 5 is a graph for showing relationship between a arithmetic roughness average and current efficiency.

Further, a second electroluminescent layer and a second electrode are formed over the first electroluminescent layer formed in the same conditions as those shown in FIG. 4 to have the same device configuration as that shown in FIG. 3. Then, device characteristics of the obtained electroluminescent element were measured. FIG. 5 shows the measurement results. The device characteristics of the electroluminescent element are described by a current efficiency (cd/A).

In FIG. 5, the horizontal axis represents current density applied to a first electrode during electrolytic polymerization, the left side vertical axis represents an arithmetic roughness average of a film surface of a first electroluminescent layer formed by electrolytic polymerization, and the right side vertical axis represents current efficiency of the electroluminescent element. Also in this case, the area of the electrode is 2×2 mm$^2$, and current density and time for applying a current were controlled so that total quantity of electrical charge is 1.2 mC/cm$^2$. Therefore, the measurement results of an arithmetic roughness average (Ra) and current efficiency are shown in the case that the electroluminescent element is formed in the conditions that the current density is applied at 0.20, 0.4, and 0.6 mA/cm$^2$ for 6, 3, and 2 sec., respectively.

With respect to the current density, an arithmetic roughness average, and current efficiency, the results show that current efficiency was improved by reducing an arithmetic roughness average by controlling current density. The results shown in FIGS. 4 and 5 show that an arithmetic roughness average (Ra) can be reduced especially when the current density falls within the range of from 0.4 to 1.5 mA/cm$^2$ and the time for applying a current falls within the range of from 0.8 to 3.0 sec. Consequently, an arithmetic roughness average (Ra) can be reduced, and current efficiency can be improved.

Figure 12:
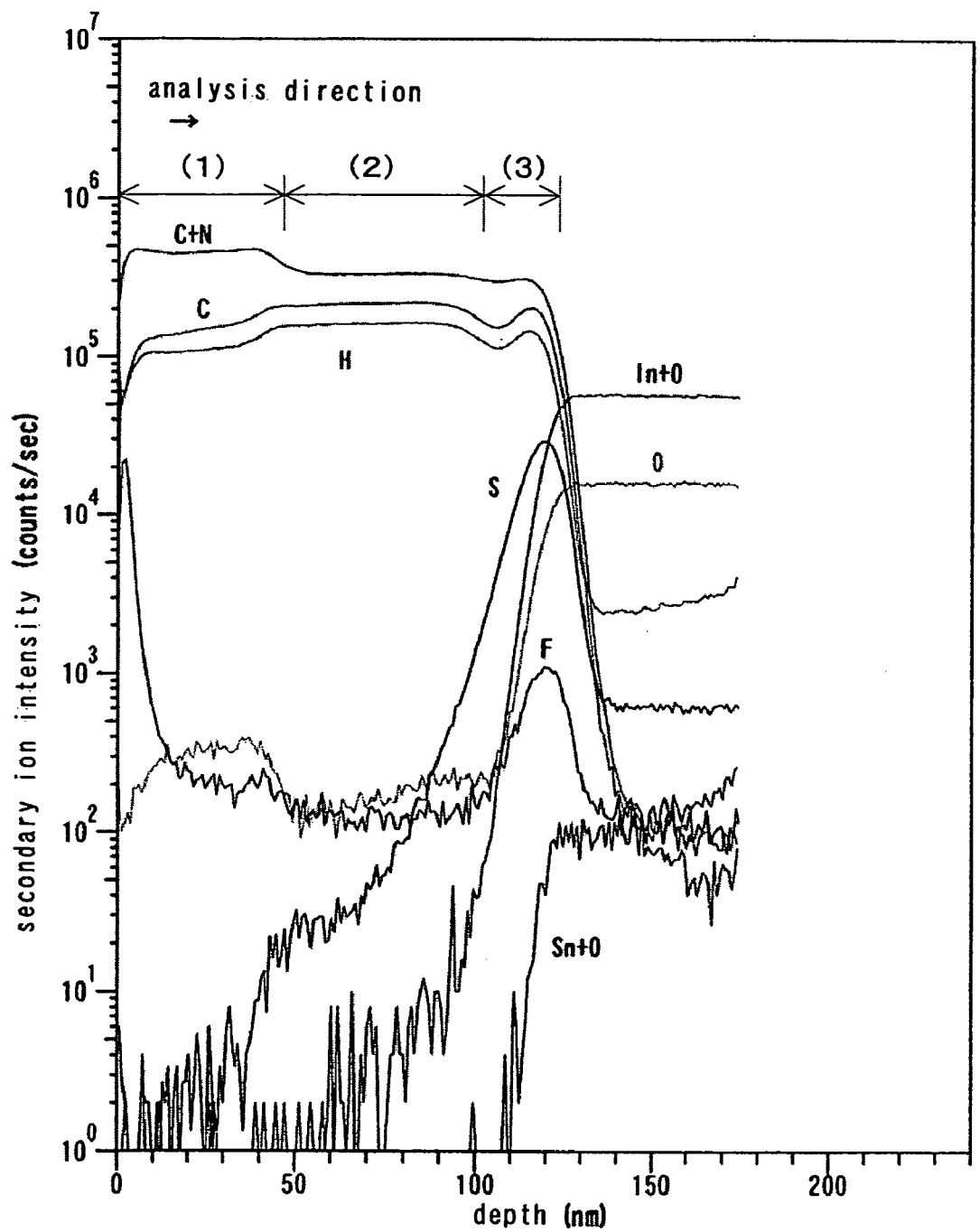
FIG. 12 shows measurement results by SIMS for electroluminescent element shown in FIG. 3.

Secondary Ion Mass Spectrometry (SIMS) was carried out focusing on S atoms contained in thiophene. Here, the electroluminescent element shown in FIG. 3 was used as a sample. Primary ions (Cs+) were irradiated in the sample from the side of the second electrode. As shown in FIG. 12, the peak of secondary ion intensity of S was occurred in the region where secondary ion intensity of C+N, C, and H was decreased drastically and secondary ion intensity of In+O was increased drastically. Therefore, the formation of a first electroluminescent layer by an electrolytic polymerization was recognized over a first electrode containing In. SIMS used here was carried out as the following procedure, that is, an ion beam was emitted to the surface of a solid sample in vacuo, and ejected secondary ions (constituent atoms of the sample) from the sample were sorted on the basis of mass-to-charge ratio, then, mass spectrometry was carried out.

EXAMPLE 2

In this example, an active matrix panel in which a driver circuit unit and a pixel portion are formed over one substrate and a plurality of electroluminescent elements having electroluminescent layers formed by electrolytic polymerization is formed in the pixel portion will be explained with reference to FIGS. 6A, 6B and 7.

Figure 6A:
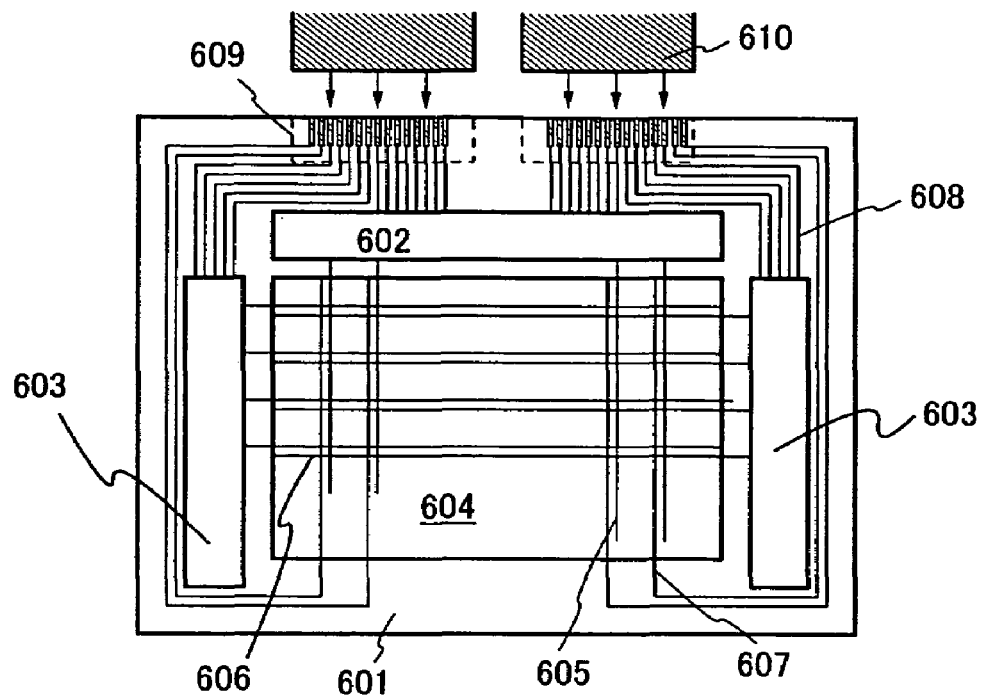
FIGS. 6A and 6B are explanatory views for showing an active matrix panel.

As shown in FIG. 6A, a source side driver circuit 602, a gate side driver circuit 603, which are included in a driver circuit unit, and a pixel portion 604 are formed over a substrate 601. Signal lines 605, scanning lines 606, and current supply lines 607 are formed over a pixel portion 604. In addition, the source side driver circuit 602 and the gate side driver circuit 603 are connected to the outside via lead wirings 608. Further, the current supply lines 607 are also connected to the outside via the lead wirings 608.

The lead wirings 608 can connect electrically to the outside by connecting to an FPC 610 in a connection portion 609.

Figure 6B:
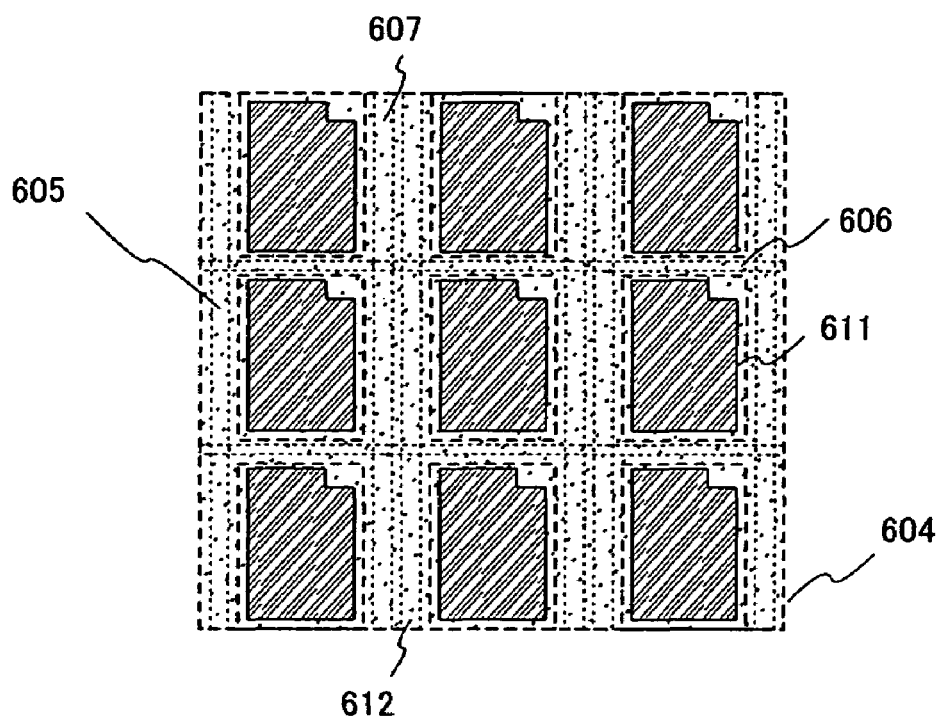

FIG. 6B is an enlarged view showing the pixel portion 604. In the pixel portion 604, a plurality of first electrodes 611 including a plurality of pixels is formed. Though not shown, the first electrodes 611 connect electrically to TFTs formed previously over a substrate via wirings.

The signal lines 605, the scanning lines 606, and the current supply lines 607 are formed in the periphery of the first electrodes 611. An insulating layer 612 formed over the pixel portion 604 covers the signal lines 605, the scanning lines 606, and the current supply lines 607 except the first electrodes 611.

According to this embodiment, a predetermined current is applied from a power source to the first electrodes 611 formed over a panel via the FPC 610 to carry out electrolytic polymerization for forming the first electroluminescent layer which is a part of an electroluminescent layer over the first electrode. The electrolytic polymerization can be carried out in accordance with the same procedure explained in Embodiment with the equipment illustrated in FIG. 1A.

A panel according to this embodiment has diagonal conjugate diameter of 1.89 inches, a pixel portion has the size of 11.56 cm$^2$, the number of pixels is 176×3×184, the first electrodes 611 which are exposed formed in each pixel has the size of 5412 μm$^2$. Here, since the first electroluminescent layer is formed simultaneously over all of the first electrodes 611, the area of the electrode is 5.26 cm$^2$.

Further, electrolytic solution in a reaction tank contains thiophene of 10 mM as monomer, acetonitrile as a solvent, and TBAP of 0.1 M as a supporting electrolyte.

According to this example, an-electrolytic polymerization film serving as a first electroluminescent layer can be formed by applying a current of 3.156 mA for two seconds.

After forming the electrolytic polymerization film, the substrate is taken together with a support medium from electrolytic solution and dried at 110° C. in vacuo.

Figure 7:
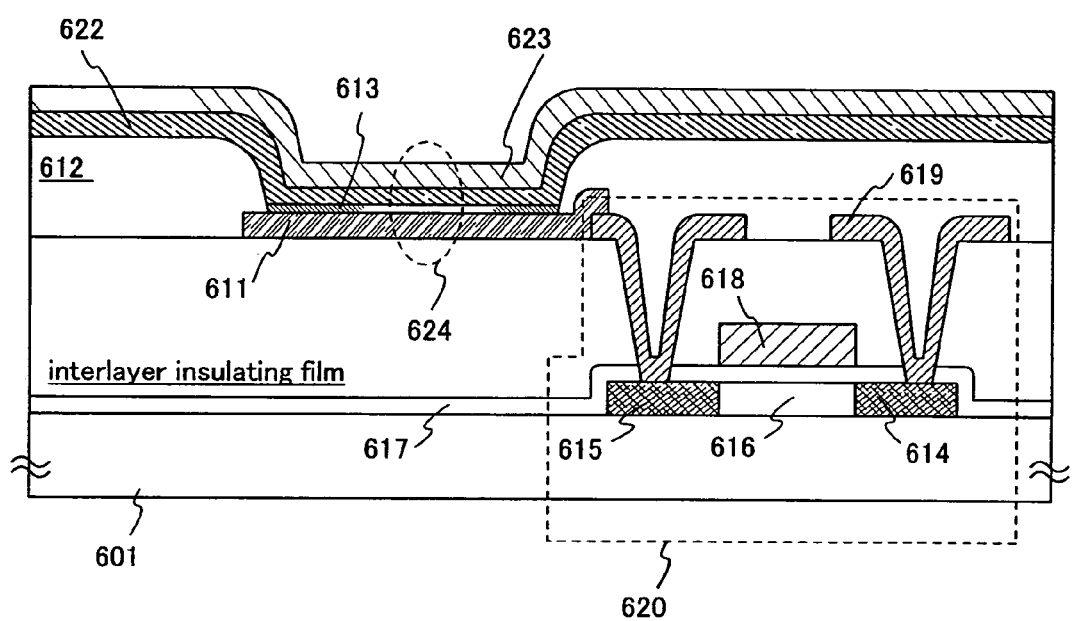
FIG. 7 is an explanatory cross-sectional view for showing an electroluminescent element connected to a TFT.

After forming the first electroluminescent layer over the first electrode 611 as described above, an electroluminescent element as shown in FIG. 7 can be formed by stacking another layer over the first electroluminescent layer. Further, the electroluminescent element can also be formed as the following manner, that is, the FPC shown in FIG. 6A is detached from the substrate after forming the first electroluminescent layer, and subsequent processes are carried out. FIG. 7 shows a part of the cross-sectional structure of a pixel formed in the pixel portion shown in FIG. 6B.

The first electrode 611 is electrically connected to a TFT 620 comprising a source region 614, a drain region 615, a channel formation region 616, a gate insulating film 617, and a gate electrode 618 via a wiring 619. The TFT 620 and the edges of the first electrode 611 are covered by the insulating layer 612.

A second electroluminescent layer 622 is formed over a first electroluminescent layer 613. The second electroluminescent layer 622 according to this example is formed to have a lamination structure of a hole transporting layer and a light-emitting layer by vapor deposition, which is similar to that in Example 1.

An electroluminescent element 624 is formed by forming a second electrode 623 over the second electroluminescent layer 622.

By practicing this example, a panel which has a driver circuit unit and a pixel portion over one substrate, and which has an electroluminescent layer formed by electrolytic polymerization according to the invention can be manufactured.

EXAMPLE 3

Figure 8A:
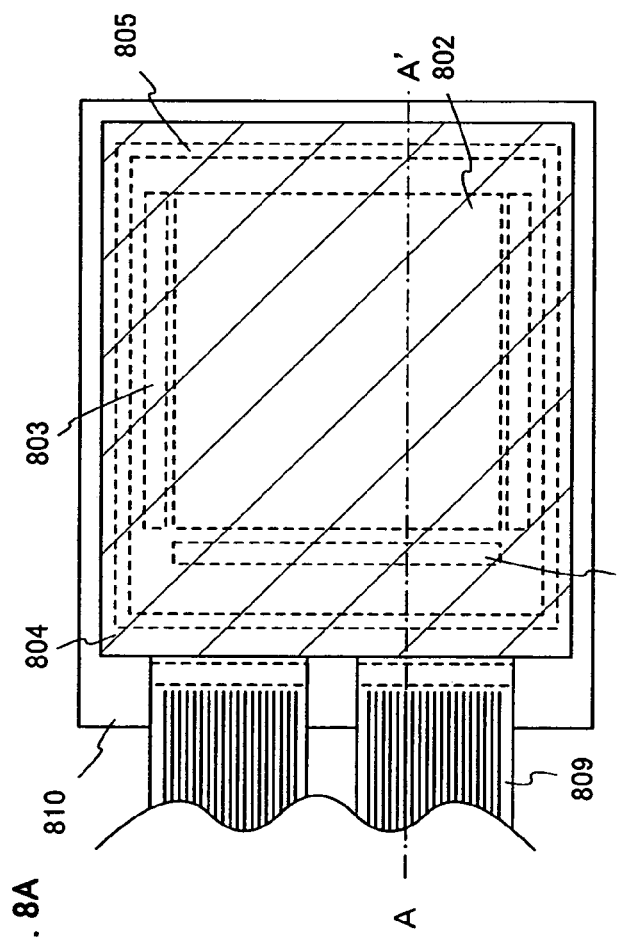
FIGS. 8A and 8B are explanatory views for showing a light-emitting device.
Figure 8B:
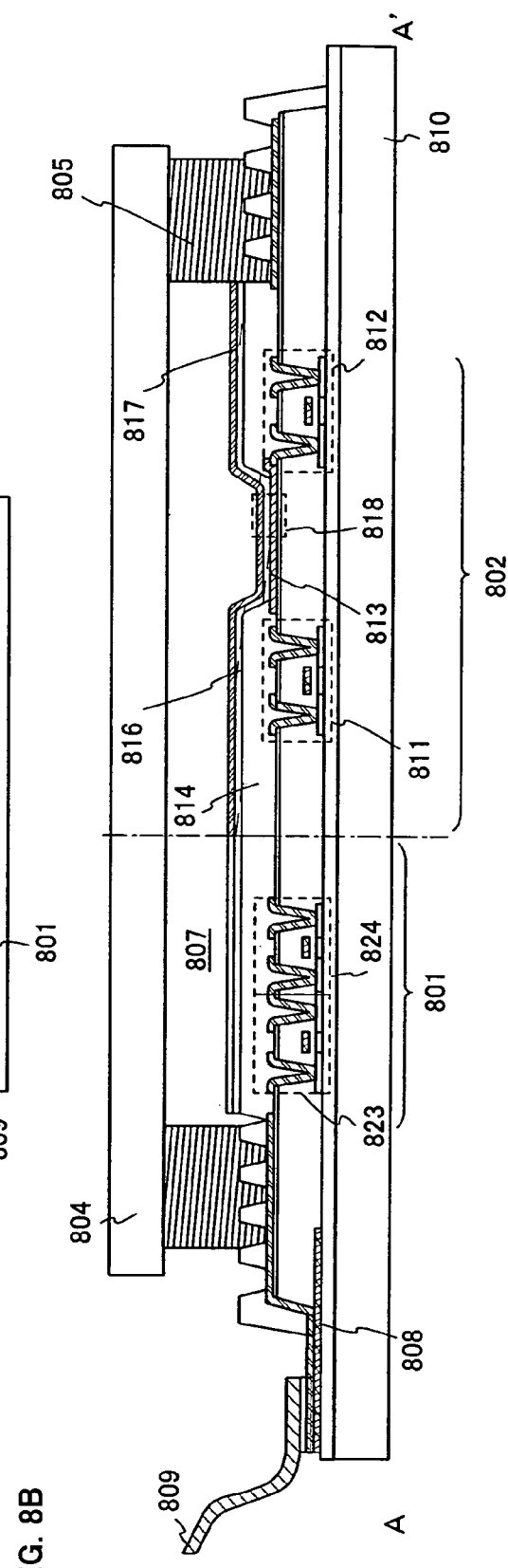

In this example, a light-emitting device having an electroluminescent element according to the present invention in a pixel portion will be explained with reference to FIGS. 8A and 8B. FIG. 8A is a top view of a light-emitting device. FIG. 8B is a cross-sectional view of FIG. 8A taken along the line A–A'. Reference numeral 801 by a dotted line denotes a source side driver circuit; reference numeral 802 denotes a pixel portion; 803, a gate side driver circuit; 804, a sealing substrate; and 805, sealing agent. The inside portion surrounded by the sealing agent 805 is space 807.

Reference 808 denotes a lead wiring for transmitting signals inputted to the source signal line driver circuit 801 and the gate signal line driver circuit 803. The lead wiring receives video signals, clock signals, start signals, or reset signals from an FPC (flexible printed circuit) 809 serving as an external input terminal. Although only FPC is illustrated in the drawing, a PWB (printed wirings board) may be attached to the FPC. As used in this specification, the term "light-emitting device" refers not to only a main body of a light-emitting device but also to the main body provided with the FPC 809 or PWB.

Then, a cross-sectional structure will be explained with reference to FIG. 8B. A driver circuit and a pixel portion are formed over a substrate 810. In FIG. 8B, the source side driver circuit 801 as a driver circuit unit and the pixel portion 802 are illustrated.

The source signal line driver circuit 801 is provided with a CMOS circuit formed by combining an n-channel TFT 823 and a p-channel TFT 824. A TFT for forming a driver circuit may be formed by a known CMOS, PMOS, or NMOS circuit. In this example, a driver integrated type in which a driver circuit is formed over a substrate is described, but not exclusively, the driver circuit can be formed outside instead of over a substrate.

The pixel portion 802 includes a plurality of pixels including a switching TFT 811, a current control TFT 812, and a first electrode 813 connected electrically to the drain of the current control TFT 812. Further, an insulator 814 is formed to cover the edge of the first electrode 813. Here, the insulator 814 is formed by a positive type photosensitive acrylic resin film.

In order to make favorable coverage, an upper edge portion and a lower edge portion of the insulator 814 are formed to have a curved face having a radius of curvature. For example, positive type photosensitive acrylic is used as a material for the insulator 814, only upper edge portion of the insulator 814 is preferably having a radius of curvature (from 0.2 to 3 μm). As the insulator 814, either a negative type photosensitive resin that becomes insoluble to etchant by light or a positive type photosensitive resin that becomes dissoluble to etchant by light can be used.

An electroluminescent layer 816 and a second electrode 817 are formed over the first electrode 813, respectively. As a material for the first electrode 813 serving as an anode, a material having a large work function is preferably used. For instance, the first electrode can be formed by a single layer such as an ITO (indium tin oxide) film, an IZO (indium zinc oxide) film, a titanium nitride film, a chromic film, a tungsten film, a Zn film, or a Pt film; a lamination layer including a film containing mainly titanium nitride and a film containing mainly aluminum; a three lamination layer including a titanium nitride film, a film containing aluminum as its main component, and a titanium nitride; or the like. In case of adopting the lamination layer, the first electrode can be formed to have a low resistance as a wiring, and make good ohmic contact, and serve as an anode.

The electroluminescent layer 816 is formed by electrolytic polymerization according to the invention. In case of forming the electroluminescent layer 816 to have a lamination structure, an electroluminescent layer formed by electrolytic polymerization and another electroluminescent layer formed by another method can be stacked. As another method for forming the electroluminescent layer, vapor deposition using an evaporation mask, coating, or ink jetting can be used.

Among the electroluminescent layers 816, the film formed by electrolytic polymerization is formed by oligomer or polymer. A film formed by another method may be formed by either low molecular weight materials or high molecular weight materials. In addition, an electroluminescent layer can be partly formed by an inorganic compound as well as an organic compound.

As a material for the second electrode (cathode) 817 formed over the electroluminescent layer 816, a material having a small work function (Al, Ag, Li, Ca, alloys of these elements such as MgAg, MgIn, AlLi, or inorganic materials $CaF_2$, or CaN) can be used. In case that light generated from the electroluminescent layer 816 pass through the second electrode (cathode) 817, the second electrode (cathode) 817 is preferably formed by a lamination layer including a thin metal film and a transparent conductive film (alloys such as indium tin oxide (ITO), indium zinc oxide ($In_2O_3$—ZnO), zinc oxide (ZnO), or the like).

The sealing substrate 804 is pasted onto the substrate 810 with the sealing agent 805 to encapsulate an electroluminescent element 818 within the space 807 surrounded by the substrate 810, the sealing substrate 804, and the sealing agent 805. The invention comprehends not only the case that the space 807 is filled with inert gases (such as nitrogen or argon) but also the case that the space 807 is filled with the sealing agent 805.

The sealing agent 805 is preferably formed by epoxy-based resin. In addition, it is desirable that the material for the sealing agent inhibits the penetration of moisture or oxygen as much as possible. As a material for the sealing substrate 804, a plastic substrate such as FRP (fiberglass-reinforced plastics), PVF (polyvinyl fluoride), polyester, or acrylic can be used besides a glass substrate or a quartz substrate.

Accordingly, a light-emitting device having an electroluminescent element according to the invention can be obtained.

The light-emitting device described in this example can be practiced by combining freely with the configuration of the electroluminescent element explained in Examples 1 and 2.

EXAMPLE 4

Various electric appliances completed by using a light-emitting device having an electroluminescent element according to the present invention will be explained in this example.

Given as examples of such electric appliances manufactured by using the light-emitting device having the electroluminescent element according to the invention: a video camera, a digital camera, a goggles-type display (head mount display), a navigation system, a sound reproduction device (a car audio equipment, an audio set and the like), a laptop personal computer, a game machine, a portable information terminal (a mobile computer, a cellular phone, a portable game machine, an electronic book, or the like), an image reproduction device including a recording medium (more specifically, a device which can reproduce a recording medium such as a digital versatile disc (DVD) and so forth, and includes a display for displaying the reproduced image), or the like. FIGS. 9A to 9G show various specific examples of such electric appliances.

Figure 9A:
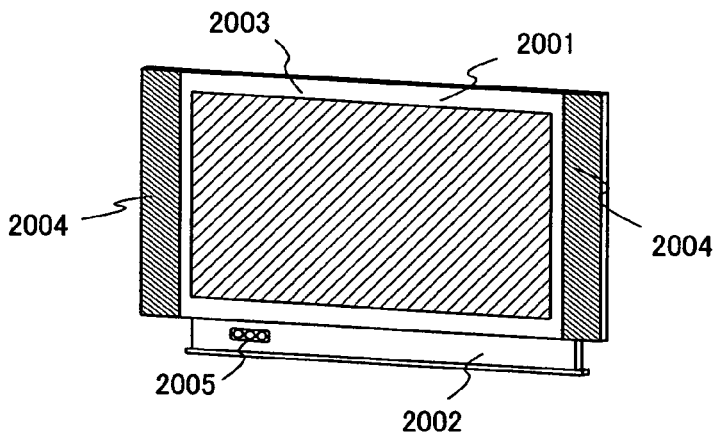
FIGS. 9A to 9G are explanatory views for showing electric appliances.

FIG. 9A illustrates a display device which includes a casing 2001, a support table 2002, a display portion 2003, a speaker portion 2004, a video input terminal 2005, or the like. The light-emitting device having the electroluminescent element according to the invention can be used for the display portion 2003. The display device is including all of the display devices for displaying information, such as a personal computer, a receiver of TV broadcasting, an advertising display, and the like.

Figure 9B:
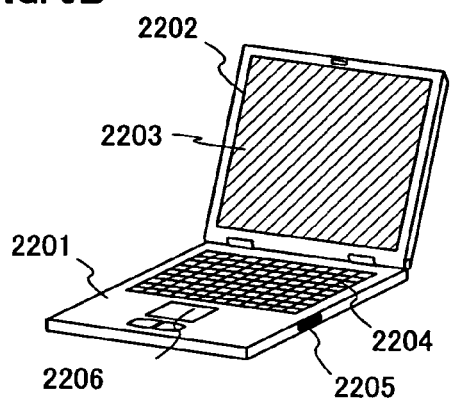

FIG. 9B illustrates a laptop computer which includes a main body 2201, a casing 2202, a display portion 2203, a keyboard 2204, an external connection port 2205, a pointing mouse 2206, or the like. The light-emitting device having the electroluminescent element according to the invention can be used to the display portion 2203.

Figure 9C:
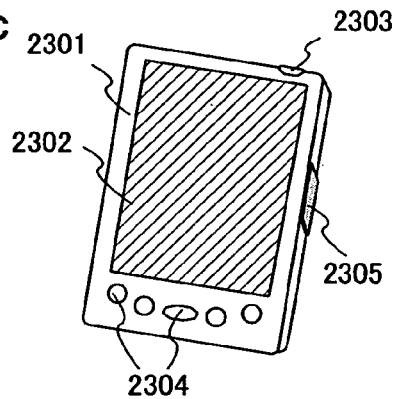

FIG. 9C illustrates a mobile computer which includes a main body 2301, a display portion 2302, a switch 2303, an operation key 2304, an infrared port 2305, or the like. The light-emitting device having the electroluminescent element according to the invention can be used to the display portion 2302.

Figure 9D:
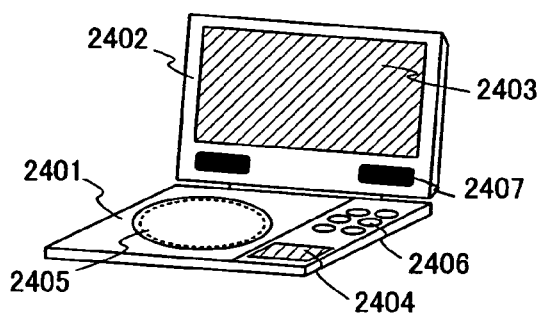

FIG. 9D illustrates an image reproduction device including a recording medium (more specifically, a DVD reproduction device), which includes a main body 2401, a casing 2402, a display portion A 2403, another display portion B 2404, a recording medium (DVD or the like) reading portion 2405, an operation key 2406, a speaker portion 2407, or the like. The display portion A 2403 is used mainly for displaying image information, while the display portion B 2404 is used mainly for displaying character information. The light-emitting device having the electroluminescent element according to the invention can be used to the display potion A 2403 and the display portion B 2404. Note that the image reproduction device with a recording medium further includes a domestic game machine or the like.

Figure 9E:
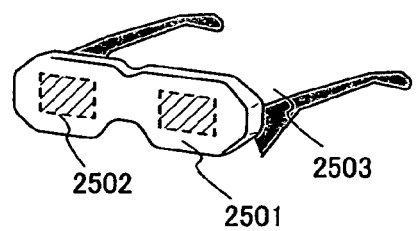

FIG. 9E illustrates a goggle type display (head mounted display), which includes a main body 2501, a display portion 2502, and an arm portion 2503. The light-emitting device having the electroluminescent element according to the invention can be used to the display portion 2502.

Figure 9F:
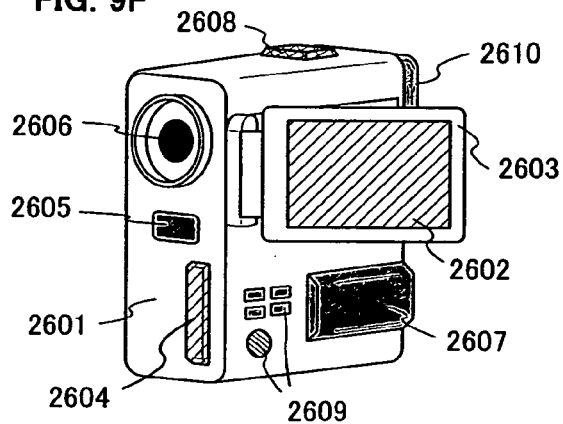

FIG. 9F illustrates a video camera which includes a main body 2601, a display portion 2602, a casing 2603, an external connecting port 2604, a remote control receiving portion 2605, an image receiving portion 2606, a battery 2607, a sound input portion 2608, an operation key 2609, an eyepiece potion 2610, or the like. The light-emitting device having the electroluminescent element according to the invention can be used to the display portion 2602.

Figure 9G:
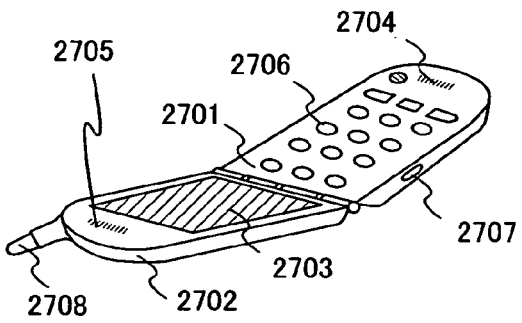
Figure 10A:
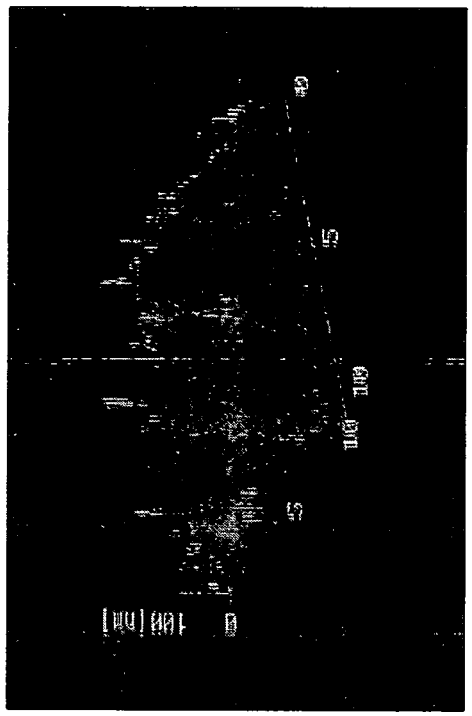
FIGS. 10A to 10D show AFM photographs showing surface states.
Figure 10B:
Figure 10C:
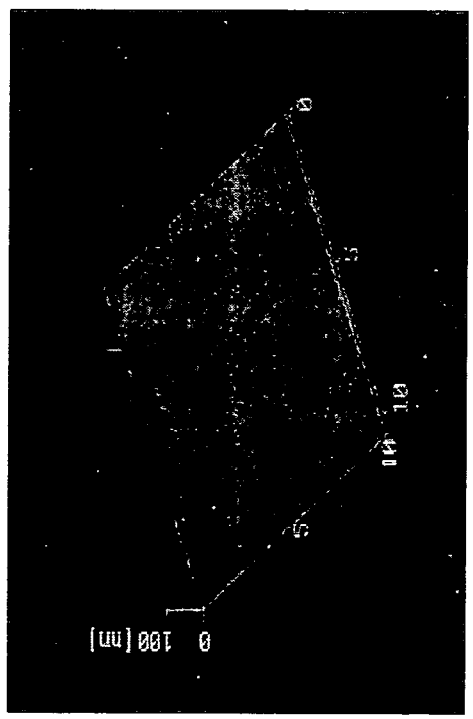
Figure 10D:
Figure 11B:
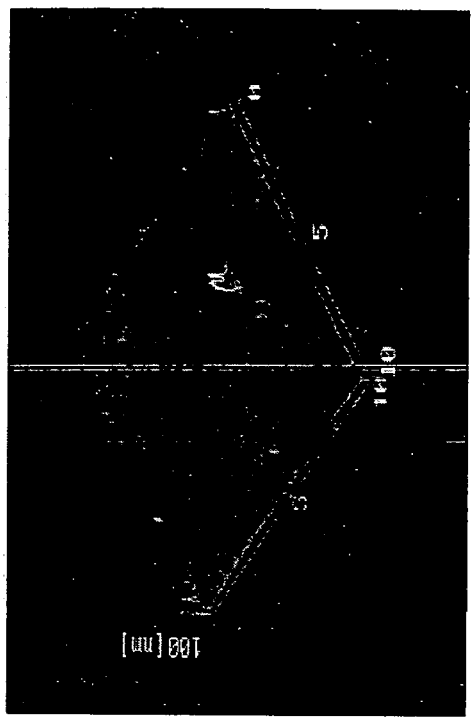
FIGS. 11A to 11D shows AFM photographs showing a surface state.
Figure 11D:
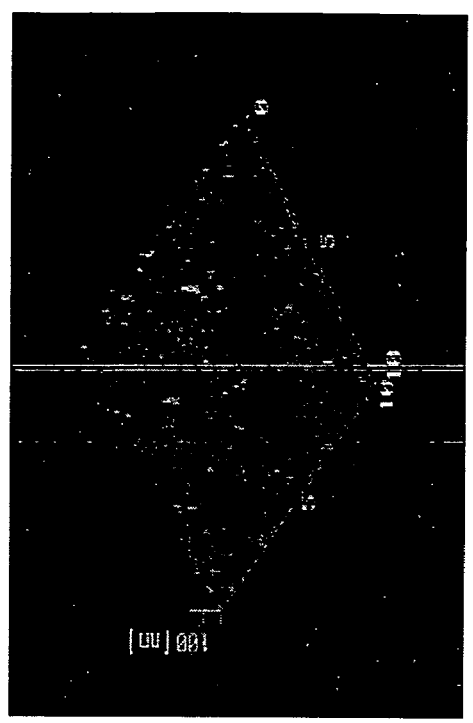
Figure 11A:
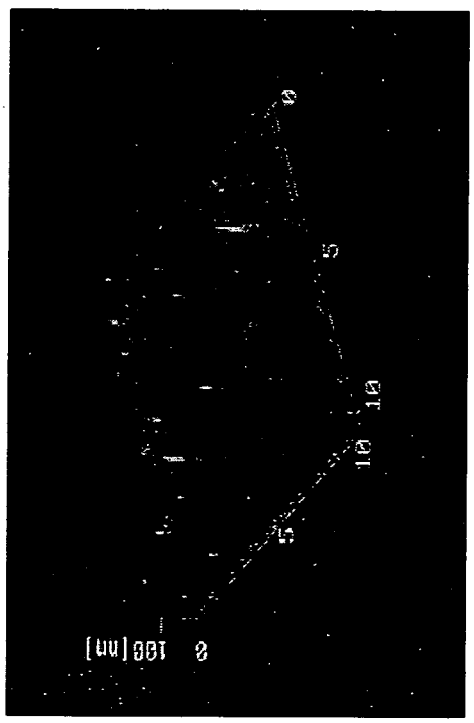
Figure 11C:
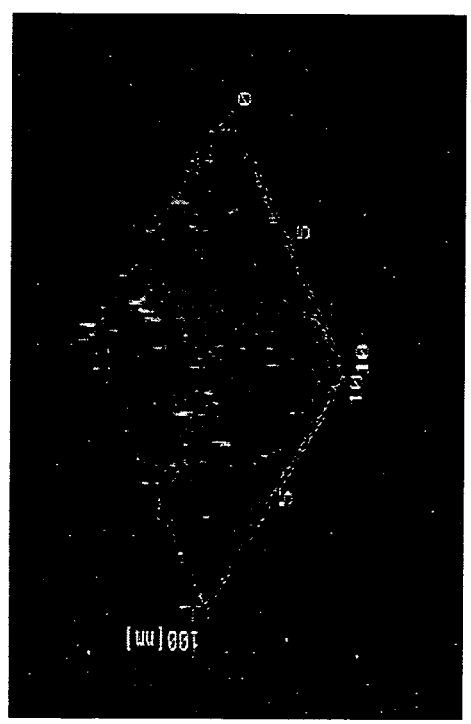

FIG. 9G illustrates a cellular phone which includes a main body 2701, a casing 2702, a display portion 2703, a sound input portion 2704, a sound output portion 2705, an operation key 2706, an external connecting port 2707, an antenna 2708, or the like. The light-emitting device having the electroluminescent element according to the invention can be used to the display portion 2703.

As set forth above, the light-emitting device having the electroluminescent element according to the invention can be applied variously to a wide range of electric appliances in all fields. By applying the light-emitting device to various fields' electric appliances, low power consumption and long lifetime can be achieved.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A method for manufacturing an electroluminescent device comprising a step of forming an electroluminescent layer between a pair of electrodes in the electroluminescent device,
    wherein the electroluminescent layer is formed using an electrochemical method by flowing a current to one of the pair of electrodes with a current density from 0.4 to 1.5 mA/cm$^2$ for 0.8 to 3.0 seconds.

2. A method for manufacturing an electroluminescent device according to claim 1, wherein the electroluminescent layer comprises a compound selected from the group consisting of pyrrol, indol, thiophene, 3,4-ethylenedioxythiophene, benzene, naphthalene, azulene, and phenylene oxide.

3. A method for manufacturing an electric appliance having the electroluminescent device according to claim 1,
    wherein the electric appliance is selected from the group consisting of a display device, a laptop computer, a mobile computer, an image reproduction device, a goggle type display, a video camera and a cellular phone.

4. A method for manufacturing an electroluminescent device comprising a step of forming an electroluminescent layer between a pair of electrodes in the electroluminescent device,
    wherein the electroluminescent layer is formed using an electrochemical method by flowing a current with a current density from 0.4 to 1.5 mA/cm$^2$ to one of the pair of electrodes for 0.8 to 3.0 seconds, and
    wherein total quantity of electrical charge per unit area of the one of the pair of electrodes is from 1.0 to 1.2 mC/cm$^2$ in the electrochemical method.

5. A method for manufacturing an electroluminescent device according to claim 4, wherein the electroluminescent layer comprises a compound selected from the group consisting of pyrrol, indol, thiophene, 3,4-ethylenedioxythiophene, benzene, naphthalene, azulene, and phenylene oxide.

6. A method for manufacturing an electric appliance having the electroluminescent device according to claim 4,
    wherein the electric appliance is selected from the group consisting of a display device, a laptop computer, a mobile computer, an image reproduction device, a goggle type display, a video camera and a cellular phone.

7. A method for manufacturing an electroluminescent device comprising a step of forming an electroluminescent layer between a pair of electrodes in the electroluminescent device,
    wherein the electroluminescent layer has a lamination structure comprising a first electroluminescent layer and a second electroluminescent layer,
    wherein the first electroluminescent layer is formed using an electrochemical method by flowing a current to one of the pair of electrodes with a current density from 0.4 to 1.5 mA/cm$^2$ for 0.8 to 3.0 seconds; and
    wherein the second electroluminescent layer is formed by vapor deposition.

8. A method for manufacturing an electroluminescent device according to claim 7, wherein the first electroluminescent layer comprises a compound selected from the group consisting of pyrrol, indol, thiophene, 3,4-ethylenedioxythiophene, benzene, naphthalene, azulene, and phenylene oxide.

9. A method for manufacturing an electric appliance having the electroluminescent device according to claim 7,
    wherein the electric appliance is selected from the group consisting of a display device, a laptop computer, a mobile computer, an image reproduction device, a goggle type display, a video camera and a cellular phone.

10. A method for manufacturing an electroluminescent device comprising a step of forming an electroluminescent layer between a pair of electrodes in the electroluminescent device,
    wherein the electroluminescent layer has a lamination structure comprising a first electroluminescent layer and a second electroluminescnet layer,
    wherein the first electroluminescent layer is formed using an electrochemical method by flowing a current to one of the pair of electrodes with a current density from 0.4 to 1.5 mA/cm$^2$ for 0.8 to 3.0 seconds,
    wherein total quantity of electrical charge per unit area of the one of the pair of electrodes is from 1.0 to 1.2 mC/cm$^2$ in the electrochemical method, and
    wherein the second electroluminescent layer is formed by vapor deposition.

11. A method for manufacturing an electroluminescent device according to claim 10, wherein the first electroluminescent layer comprises a compound selected from the group consisting of pyrrol, indol, thiophene, 3,4-ethylenedioxythiophene, benzene, naphthalene, azulene, and phenylene oxide.

12. A method for manufacturing an electric appliance having the electroluminescent device according to claim 10,
    wherein the electric appliance is selected from the group consisting of a display device, a laptop computer, a mobile computer, an image reproduction device, a goggle type display, a video camera and a cellular phone.

13. A method for manufacturing an electroluminescent device comprising a step of forming an electroluminescent layer between a pair of electrodes in the electroluminescent device,
    wherein the electroluminescence layer comprises:
        a hole injecting layer;
        a hole transporting layer; and
        a light-emitting layer,
    wherein the hole injecting layer is formed using an electrochemical method by flowing a current to one of the pair of electrodes with a current density from 0.4 to 1.5 mA/cm$^2$ for 0.8 to 3.0 seconds, and
    wherein the hole transporting layer and the light-emitting layer are formed by vapor deposition.

14. A method for manufacturing an electroluminescent device according to claim 13, wherein the hole injecting layer comprises a compound selected from the group consisting of pyrrol, indol, thiophene, 3,4-ethylenedioxythiophene, benzene, naphthalene, azulene, and phenylene oxide.

15. A method for manufacturing an electric appliance having the electroluminescent device according to claim 13,
    wherein the electric appliance is selected from the group consisting of a display device, a laptop computer, a mobile computer, an image reproduction device, a goggle type display, a video camera and a cellular phone.

16. A method for manufacturing an electroluminescent device comprising a step of forming an electroluminescent layer between a pair of electrodes in the electroluminescent device,
    wherein the electroluminescent layer comprises:
        a hole injecting layer;
        a hole transporting layer; and
        a light-emitting layer,
    wherein the hole injecting layer is formed using an electrochemical method by flowing a current to one of the pair of electrodes with a current density from 0.4 to 1.5 mA/cm$^2$ for 0.8 to 3.0 seconds,
    wherein total quantity of electrical charge per unit area of the one of the pair of electrodes is from 1.0 to 1.2 mC/cm$^2$ in the electrochemical method, and
    wherein the hole transporting layer and the light-emitting layer are formed by vapor deposition.

17. A method for manufacturing an electroluminescent device according to claim 16, wherein the hole injecting layer comprises a compound selected from the group consisting of pyrrol, indol, thiophene, 3,4-ethylenedioxythiophene, benzene, naphthalene, azulene, and phenylene oxide.

18. A method for manufacturing an electric appliance having the electroluminescent device according to claim 8,
    wherein the electric appliance is selected from the group consisting of a display device, a laptop computer, a mobile computer, an image reproduction device, a goggle type display, a video camera and a cellular phone.

19. A method for manufacturing a semiconductor device comprising a step of forming an organic layer on an electrode of the semiconductor device,
wherein the organic layer is formed using an electrochemical method by flowing a current to the electrode with a current density from 0.4 to 1.5 mA/cm$^2$ for 0.8 to 3.0 seconds.

20. A method according to claim 19, wherein total quantity of electrical charge per unit area of the electrode is from 1.0 to 1.2 mC/cm$^2$ in the electrochemical method.

21. A method according to claim 19, further comprising a step of forming a second organic layer over the first organic layer by vapor deposition.

22. A method according to claim 21, wherein the second organic layer is a hole injecting layer.

* * * * *